(12) United States Patent
Lopez Rodriguez et al.

(10) Patent No.: US 9,140,746 B2
(45) Date of Patent: Sep. 22, 2015

(54) METHODS FOR DIAGNOSING THE CONDITION OF AN ELECTRICAL SYSTEM

(71) Applicant: Hewlett-Packard Development Company, L.P., Fort Collins, CO (US)

(72) Inventors: Juan Luis Lopez Rodriguez, Sant Cugat del Valles (ES); Javier Gonzales Bruno, Sant Cugat del Valles (ES); Sergio Alejandro Lopez Ramos, Sant Cugat del Valles (ES)

(73) Assignee: HEWLETT-PACKARD DEVELOPMENT COMPANY, L.P., Houston, TX (US)

( * ) Notice: Subject to any disclaimer, the term of this patent is extended or adjusted under 35 U.S.C. 154(b) by 384 days.

(21) Appl. No.: 13/684,208

(22) Filed: Nov. 22, 2012

(65) Prior Publication Data

US 2014/0139234 A1  May 22, 2014

(51) Int. Cl.
G01R 31/28 (2006.01)
G01R 31/327 (2006.01)
G01R 31/36 (2006.01)

(52) U.S. Cl.
CPC ........ *G01R 31/2836* (2013.01); *G01R 31/3275* (2013.01); *G01R 31/36* (2013.01); *G01R 31/3606* (2013.01); *G01R 31/28* (2013.01); *G01R 31/3682* (2013.01)

(58) Field of Classification Search
CPC ...... G01R 31/00; G01R 31/024; G01R 31/07; G01R 31/2812; G01R 31/2836; G01R 31/3275; G01R 31/36; G01R 31/3606; G01R 31/3634; G01R 31/3679; G01R 31/3682
USPC .................................. 324/537, 500
See application file for complete search history.

(56) References Cited

U.S. PATENT DOCUMENTS

| 4,045,732 | A   |   | 8/1977  | Yashiro et al.             |
|-----------|-----|---|---------|----------------------------|
| 5,337,013 | A   | * | 8/1994  | Langer et al. ....... 324/537 |
| 5,497,095 | A   | * | 3/1996  | Ueyama et al. ....... 324/537 |
| 7,106,047 | B2  | * | 9/2006  | Taniguchi ........... 324/126 |
| 7,847,562 | B2  | * | 12/2010 | Montgomery et al. ... 324/542 |

* cited by examiner

*Primary Examiner* — Hoai-An D Nguyen
(74) *Attorney, Agent, or Firm* — Michael A. Dryja

(57) ABSTRACT

Diagnosing the condition of an electrical system includes identifying the intended operating status of the system. An electrical consumption in the system is measured. The measured electrical consumption is compared at least with one predetermined electrical consumption that is associated to the intended operating status of the system. The condition of the system is diagnosed based on the comparison.

19 Claims, 3 Drawing Sheets

METHODS FOR DIAGNOSING THE CONDITION OF AN ELECTRICAL SYSTEM

In electrical or electronic systems, such as a control unit for a printing apparatus, which comprise a number of different electrical components or subsystems, it may be desirable to diagnose during operation the condition of the system or of one or several components of the system. This may be useful for example to detect errors, malfunctioning, aging or the like, and if convenient provide for replacement, repair, servicing, or other maintenance operations.

It is known to control the operation of a device such as a motor by measuring, for example, the associated current or voltage, or by using sensors such as encoders to verify its rotation. Such measurements or sensors are however limited to specific components: individual sensors and circuitry are therefore required for each component or device within a system that needs to be controlled.

It is also known to verify electronic components during manufacture and before they are assembled in an apparatus; for example, application-specific integrated circuits (ASIC) may be tested by applying a predetermined input current, measuring the output current, and discarding the component if the output current is not within an expected range. However, such tests do not allow diagnosing a system or component once it is in operation, for example associated to an apparatus.

U.S. Pat. No. 4,045,732 discloses a device for sensing the operative status of electrical equipment, wherein a sensor distinguishes between a standby current waveform and a distinctly different current waveform generated when an AC/DC converter draws current in a full power mode. Such a device does not diagnose the condition of a system or of a component of a system that is in an operating status; that is, it does not diagnose if the system or the component are functioning as intended.

Examples of the methods disclosed in the present application may allow diagnosing, during operation, the condition of a system and/or of a component within a system, in a simple and reliable way.

Some non-limiting examples will be described in the following with reference to the appended drawings, in which.

The electrical power consumption of digital or analogue circuits, or systems in general, may depend on their components, such as particular devices, subsystems, drivers, transducers, and the like, and also on the processes that are happening in the system at a given time, and may depend on the internal hardware design. Calculating the consumption of each device and of the system at a given time may thus be complex.

However, even if it is not known which particular processes are occurring in the system, and how the consumption may be calculated, it has been found that for at least some systems the electrical consumption may be always approximately the same when the system is in a certain status, that is, when the system is performing certain functions.

For example, in a system that includes a control unit and a driver for controlling a motor, the consumption of the system that includes the driver may be always approximately the same whenever the motor is caused to turn at a certain speed in a certain direction, provided that other components of the system are also in the same operating status.

Furthermore, it has been found that for at least some systems and for at least certain operating statuses of the system, the consumption may be different in different operating statuses, and the difference in consumption between one status and another may be sufficient to allow differentiating one operating status from another, based on the consumption.

On this basis, examples of methods disclosed herein may involve measuring the consumption of a system when the system is in an intended operating status, comparing this consumption with at least a predetermined consumption of the system which is associated to the intended operating status, and making a diagnose of the system condition based on the comparison: for example, determining if the system is not operating as foreseen.

Figure 1:
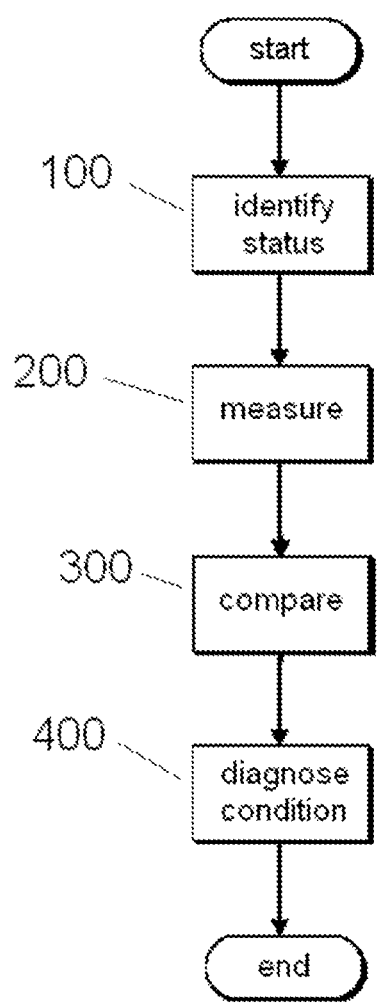
FIG. 1 is a flow diagram of an example of a method for diagnosing the condition of a system.

An example of a method for diagnosing the condition of a system during operation will be disclosed with reference to FIG. 1. The expression "during operation" is intended to indicate that such a method may be performed during the operational life of the system, and not only during a test phase before the system is set in normal operation. It is also meant to include the option that such a method is performed while the system is operating in a normal production mode, such that the method may be employed for controlling the system during its normal operation and diagnose any particular condition thereof that may arise.

For example, in case of a system associated with an apparatus such as a printer, examples of the method may be performed during normal production printing, and may therefore be employed to diagnose conditions such as failures, malfunctioning, errors, etc. during the life of the system.

In the example of FIG. 1, a method for diagnosing the condition of the system may comprise:

as shown in box 100, identifying the intended operating status of an electrical system, i.e. identifying how the system should be operating, for example because a user of the system has made certain inputs, or because a system controller has sent certain instructions to the system components;

as shown in box 200, measuring an electrical consumption in the system, for example at a specific predetermined point of the system;

as shown in box 300, comparing this measured electrical consumption with at least a predetermined electrical consumption that is associated with the intended operating status of the system, that is, the consumption that the system is known to have when it operates in said status, and that is therefore expected if all is operating correctly; and as shown in box 400, diagnosing the condition of the system based on the comparison.

In box 300, the measured electrical consumption may additionally be compared with other predetermined electrical consumptions, as will be explained later on.

The diagnosing in box 400 may, for example, establish that the system is in a condition in which it operates as intended, because the comparison shows a relatively small deviation between the measured consumption and the predetermined consumption; it may also establish that the system may be in a condition of failure, potential failure or malfunctioning; or it may also establish that the system is in a condition where, for example, one or more specific components are failing or malfunctioning.

Examples of the method do not need to be performed in the order shown in FIG. 1: for example, the identification of the intended operating status of the system may be done after the measurement of the consumption.

Examples of the method may involve performing the measuring of the electrical consumption and the comparison with predetermined electrical consumptions at time intervals during the operation of the system; in this case, the intended operating status and the corresponding predetermined electrical consumptions over time may be recorded or stored in the system from the start, for example as a function of time.

Figure 2:
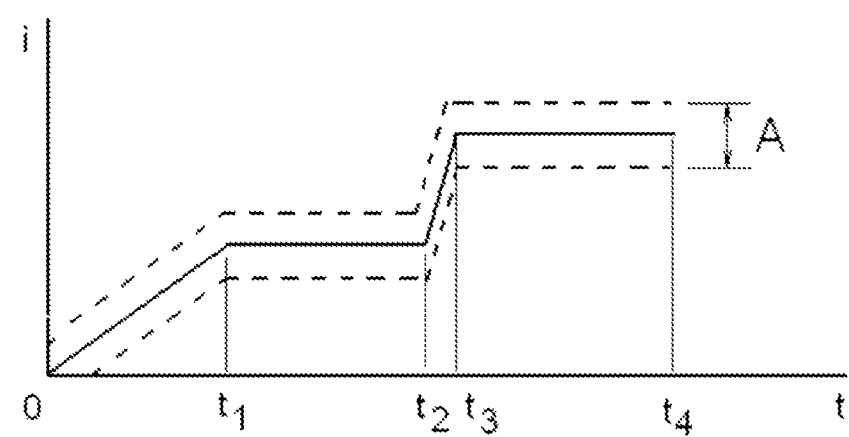
FIG. 2 is a diagram related to an example of a method performed over time.

By way of example, FIG. 2 is a diagram related to an example of a method that is performed over time: predetermined electrical consumptions such as predetermined values of the current i(t) are recorded and stored in the system as a function of time.

Furthermore, an operating status of the system may comprise a number of different phases, and have associated a predetermined consumption as a function of time, as in the example of FIG. 2, instead of a single predetermined consumption value.

For example, in FIG. 2 the time interval between $t_1$ and $t_2$ may correspond to a phase with a certain current consumption, and the time interval between $t_3$ and $t_4$ may correspond to another phase with a higher current consumption; intervals 0 to $t_1$ and $t_2$ to $t_3$ correspond to other phases in which the current consumption is not constant, but which is also predetermined for each point in time.

The i(t) function in FIG. 2 may correspond, for example, to an operating status such as "print medium advance" in a printing apparatus, in which different phases may comprise starting a motor and increasing its speed, and then maintaining the speed for some time. The consumption of the system, including the consumption of the driver that controls the motor, may follow the curve of FIG. 2, with 0-$t_2$ corresponding e.g. to the consumption during start-up, $t_2$-$t_3$ corresponding e.g. to the consumption whilst the speed is increased, and $t_3$-$t_4$ corresponding e.g. to the consumption of the driver while the motor runs at constant speed.

During operation of the system, measurements of the current may be taken at regular intervals over time, and it may be diagnosed that the system may be in a condition of failure, potential failure or malfunctioning when the difference between the measured consumption and the predetermined consumption is higher than a threshold value: for example, in FIG. 2 such a condition of failure or the like may be diagnosed if the measured current falls outside a predetermined range A around the predetermined current consumption over time.

It is possible to measure and compare the consumption only in some operating statuses, for example between $t_1$ and $t_2$ and between $t_3$ and $t_4$, or measure also during the operating statuses where the current is not constant. The range A of allowed deviation from the predetermined values may be different from phase to phase, or from one point in time to another.

The electrical consumption that is measured and predetermined in the system may be that of the whole system or of only a part thereof, depending e.g. on the point where the measure is taken, provided that the measured and the predetermined consumptions relate to the same components or can be related to each other with sufficient accuracy.

As explained above with reference to FIG. 1, in some examples the measured electrical consumption may be compared in box 300 with a set of predetermined electrical consumptions that are associated to possible operating statuses of the system; in this case, each of said operating statuses may involve a different condition of at least one component of the system.

In a simple example, in such a method one predetermined electrical consumption may be associated to a status in which the system is performing a certain function and a component of the system is enabled, and another predetermined consumption may be associated with a status in which the system is performing the same function but wherein the component of the system is disabled. This would allow the condition of the component to be diagnosed, and would identify that the component itself is failing, because it is disabled while the system is in an operating status in which the component should be enabled.

Examples of the method disclosed herein therefore allow the diagnosis not only a condition of the system as a whole, but also a condition of one or more particular components of the system. Furthermore, this may be done without sensing or controlling a specific parameter related to the component itself, but simply with a measurement of the electrical consumption, in one single and common point of the system. Several components of a system and a number of failures, potential failures, malfunctioning of such components may therefore be diagnosed with a single diagnostic solution.

Moreover such diagnostic may be simple and cost-effective, since it may be enough to measure different current consumptions in different statuses and in the presence of different conditions of the components, and generate a table linking current consumptions with conditions, and use this table during operation to diagnose the different conditions.

Examples of the method may also allow differentiating between several possible errors of failures, since e.g. the consumption may be different when a motor is not turning because it is stalled or when it is not turning because a coil has burned out. Some known solutions, such as an encoder placed to detect the motor rotation, are not able to differentiate between these two conditions.

In other examples of the method the condition of at least one component of the system may be also be diagnosed by starting with a process as described above in relation to FIG. 1, and then performing an additional process if a condition of failure, potential failure, or malfunctioning of the system is diagnosed. An example of such a method will be now described with reference to FIG. 3.

Figure 3:
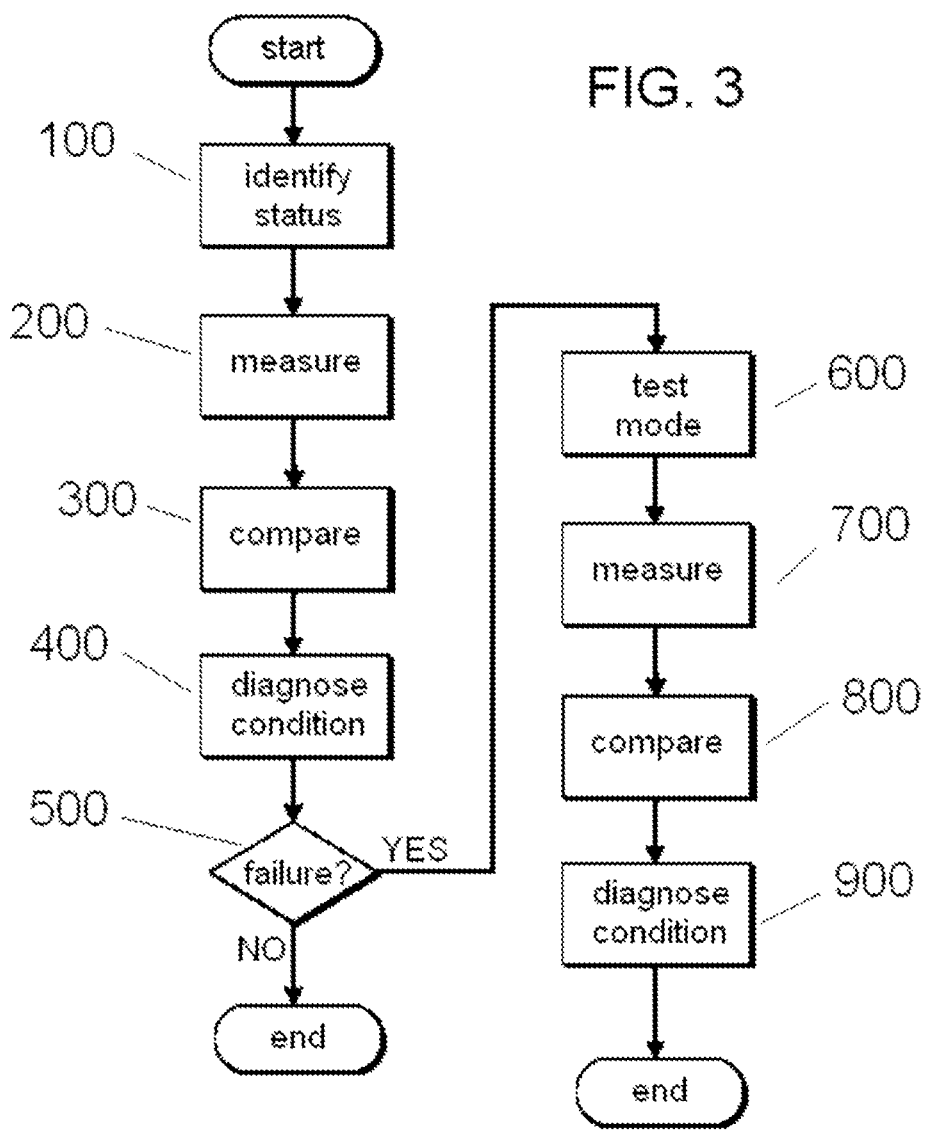
FIG. 3 shows a flow diagram of another example of a method for diagnosing the condition of a system.

As shown in FIG. 3 an example of the method may therefore start with the same process of FIG. 1 (shown by boxes 100-200-300-400 in FIG. 3), and then it may be checked as in box 500 if a condition of failure, potential failure or malfunctioning of the system has been diagnosed; in the affirmative, then the method may continue by:

causing the system to operate in a test operating mode as shown in box 600, said test mode may be designed depending on the specific condition of the system that has been found, for a specific error or failure, for a specific component, depending on the intended operating status of the system, etc.

measuring the electrical consumption in the test operating mode as shown in box 700, either in the same point of the system or in another specific point;

comparing in box 800 this measured electrical consumption with at least one predetermined electrical consumption that is associated with the test operating mode. In this case, each predetermined electrical consumption with which the measured value is compared may be associated with a different condition of at least one component of the system, similar to what has been disclosed for the previous example; and diagnosing the condition of at least one component of the system in box 900, based on the result of the comparison.

Also in such examples of the method it is therefore possible to diagnose a condition of one or more particular components of the system, without sensing or controlling a specific parameter related to the component itself, but simply with a measurement of the electrical consumption.

Examples of the method that involve running a test mode after finding a failure in the system (or in one component) allow diagnosis of a larger number of components and of different conditions in a simple way, since several different test modes may be designed and run as appropriate, depending on the diagnosis of a condition of the overall system.

For example, test operating modes may be designed to diagnose which specific component of the system is failing, and/or to diagnose different possible failure conditions of a component.

Test operating modes may also be combined with examples of a method in which the measured consumption is compared with a set of predetermined consumptions, instead of only with the predetermined consumption associated to the intended operating status; i.e. a first part of an example of a method may involve a first level of diagnosis, and then a test mode may be applied if a more detail level of diagnosis is desired.

In examples of methods disclosed herein predetermined electrical consumptions that are associated to a number of operating statuses of the system may be obtained and recorded, such that they are later available to be compared with measured consumptions.

This may be done at different points in time and in different manners. For example, the measurements may be done by running a test phase before the system is put into normal operation.

The test phase may be run for example on a sample system: the sample system may be representative of a plurality of systems, for example it may be a prototype of a system having defined features, hardware, connections, etc. that will be produced industrially (for example one specific model of a control system), or it may be one of the industrially produced systems.

The obtained predetermined consumptions may then be recorded in each system that may be represented by the sample system. This may provide good results in methods as disclosed herein, and is simple and cost effective.

In other examples, the test phase may be run on each single individual system that is produced, and the obtained predetermined electrical consumptions are recorded only in said individual system.

In such cases the accuracy of the method may be higher, since predetermined consumptions are not affected by manufacturing tolerances and unavoidable variations between individual systems of the same kind. Consequently, the range of variation around the predetermined value obtained that has to be allowed in order to avoid diagnosing potential failure conditions is smaller.

Figure 4:
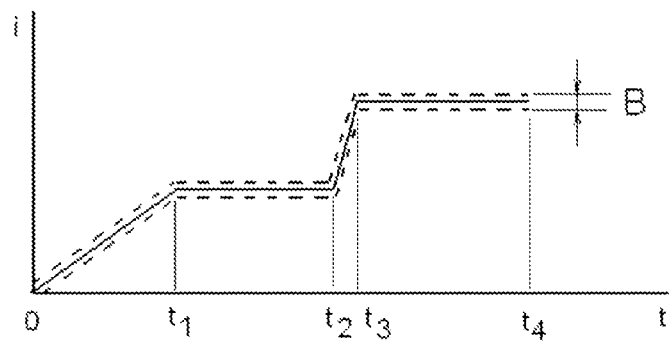
FIG. 4 is similar to FIG. 2, for another example of a method.

Examples of such a method, and wherein measurements and comparisons are done over time, as explained in relation to FIG. 2, may in this case be run with more accuracy, as shown in the diagram of FIG. 4, which represents an example similar to that of FIG. 2 but in which the predetermined consumptions over time and for different statuses have been measured on the individual system, and not on a sample system. The difference with FIG. 2 is that in this case the predetermined range B outside which the system condition is diagnosed as failing or the like is narrower than range A of FIG. 2.

The fact that the allowable variation around predetermined values is smaller may also allow to differentiate a larger number of different operating statuses and conditions of the system and system components, because with smaller ranges there is less risk of overlap in the consumptions between different operating statuses. Furthermore, it is also possible to diagnose conditions of the system or components in which a variation in consumption is not related to failure of a component, but rather to aging, thus allowing diagnosis of conditions related to the convenience of maintenance or preventive actions.

In some examples, in methods as disclosed herein the measure of the electrical consumption may be performed in a controller, to which a number of components of the system are connected.

One such example is disclosed in the following with reference to FIG. 5. This figure shows an electric system which may be related for example to the control unit of a printing apparatus.

The system comprises a controller 10 with a power supply line 11, and internal circuitry indicated with reference 12; a number of further components of the system are connected to the controller 10; by way of example, a driver 13 may have a power supply line 14 connected to the controller, and to the controller circuitry through three control lines 15, 16 and 17. The driver 13 may be associated with a motor 18 having a motor shaft 19, and supplied with power through an independent supply line 20.

Further components could be connected to the controller circuitry 12, and/or supplied with power through supply line 11; however, for simplifying the example, it will be assumed that this system is limited to the components shown.

The control lines 15, 16 and 17 between the controller 10 and the driver 13 may be set for example for enabling/disabling the motor, for controlling the direction of rotation of the motor, and for controlling the speed of the motor, respectively.

An ammeter 21 may be arranged in the controller supply line 11, to measure at any desired time the electrical consumption in the system.

Figure 5:
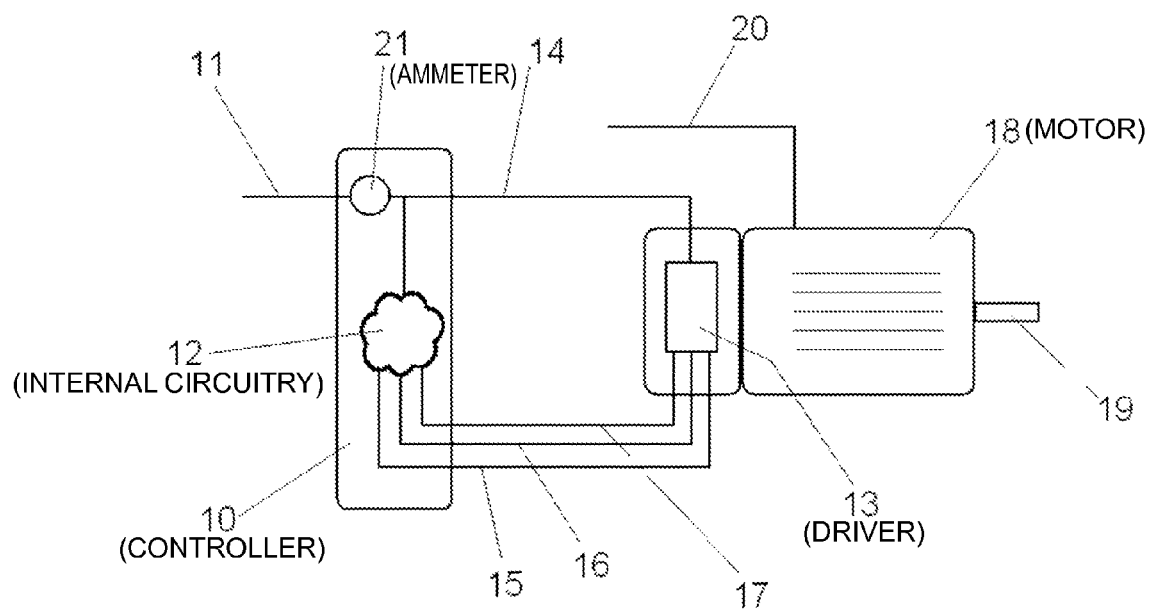
FIG. 5 shows schematically an example of an electrical system in which examples of methods for diagnosing the condition of a system or of a component thereof may be performed.

An example of a method as disclosed above applied to the system of FIG. 5 may involve obtaining predetermined electrical consumptions in different operating statuses of the system using the ammeter 21, for example before the apparatus is used in normal production.

The following predetermined consumptions may be obtained, for different operating statuses of the system:

| idle (only internal circuitry consumption) | motor disabled | motor stalled | motor free running |
|---|---|---|---|
| 6.8 mA | 55.1 mA | 65.8 mA | 80.9 mA |

It may be seen that there is a different value of the current, i.e. of the consumption, associated to each status; in an example of a method as disclosed therein it is therefore possible to diagnose the condition of the system during operation, by recording the predetermined consumptions for each operating status and, at any time during operation:

identifying the intended operating status of the system from the controller: for example, according to the controller the motor may be free running;

measuring the electrical consumption in the system by means of the ammeter 21; for example, the measured consumption may be of 66.5 mA.

comparing the measured electrical consumption (66.5 mA) with the predetermined electrical consumption that is associated to the intended operating status of the system (80.9 mA): in this case clearly there would be a discrepancy, and therefore a diagnostic could be made that the condition of the system is one of error, or failure.

Adding further operating conditions, components, etc. such that further conditions of the system or of its components may be diagnosed, in more operating statuses and with more components being connected to the controller and to the ammeter 21, involve obtaining and recording or storing a larger number of predetermined consumptions, associated to different operating statuses.

Other examples of methods disclosed herein, which allow diagnosing the condition of at least one electrical component of a system during operation, may comprise measuring an electrical consumption in the system;

comparing the measured electrical consumption with a set of predetermined electrical consumptions, each related to a possible operating conditions of at least one component of the system, at least one of the operating conditions being a failure condition, potential failure condition, or malfunctioning condition of the component; and diagnosing the condition of at least one component based on the comparison.

Applied to the above system of FIG. 5, such an example of the method may involve recording the predetermined consumptions for each operating condition, and, at any time during operation:

measuring the electrical consumption in the system by means of the ammeter 21: for example, the measured consumption may be of 66.5 mA, as above.

comparing the measured electrical consumption (66.5 mA) with the four available predetermined consumptions (6.8 mA, 55.1 mA, 65.8 mA and 80.9 mA) for the four operating conditions of the component, wherein the operating condition "motor stalled" is a failure condition, since it indicates that something prevents the motor from rotating.

In this case, the comparison would allow diagnosing that the motor is in stalled condition.

Examples of such methods for diagnosing the condition of at least one electrical component of a system during operation may comprise running a test phase for obtaining and recording the predetermined electrical consumptions related to possible operating conditions of at least one component of the system. A test phase may be run on a sample system representative of a plurality of systems, or on each single system in which an example of a method as disclosed may be employed.

The measure of the electrical consumption and the comparison with predetermined electrical consumptions may be performed at time intervals during the operation of the system.

Disclosed herein is also a computer readable medium with computer-executable instructions stored thereon that, if executed by a computer, cause the computer to implement an example of a method disclosed herein.

Although only a number of particular embodiments and examples have been disclosed herein, further variants and modifications of the disclosed print media products are possible; other combinations of the features of embodiments or examples described are also possible. Reference signs related to drawings and placed in parentheses in a claim, are solely for attempting to increase the intelligibility of the claim, and shall not be construed as limiting the scope of the claim. Thus, the scope of the present invention should not be limited by particular examples or embodiments, but should be determined only by a fair reading of the claims that follow.

The invention claimed is:

1. A method for diagnosing the condition of an electrical system during operation, comprising:
    identifying the intended operating status of the system as a whole, as one of a plurality of different operating statuses of the system as a whole in which different combinations of devices of the system are consuming power;
    measuring an electrical consumption in the system as a whole, without individually measuring the electrical consumption of any of the devices of the system;
    comparing the measured electrical consumption at least with one predetermined electrical consumption that is associated with the identified intended operating status of the system; and
    diagnosing the condition of the system based on the comparison, including determining whether the system as a whole is in actuality operating in the intended status.

2. A method as claimed in claim 1, wherein the system is diagnosed to be in a condition of failure, potential failure or malfunctioning when the difference between the measured consumption and the predetermined consumption is higher than a threshold value.

3. A method as claimed in claim 1, wherein the measured electrical consumption is compared with a set of predetermined electrical consumptions that are associated with possible operating statuses of the system, each said operating statuses involving a different condition of at least one component of the system.

4. A method as claimed in claim 3, wherein on the basis of the comparison the condition of the at least one component of the system is diagnosed.

5. A method as claimed in claim 3, wherein at least one of the possible operating statuses involves a condition of failure, potential failure or malfunctioning of the component.

6. A method as claimed in claim 1, wherein when a condition of failure, potential failure or malfunctioning of the system is diagnosed, the method further comprises
    causing the system to operate in a test operating mode,
    measuring the electrical consumption in the test operating mode,
    comparing the measured electrical consumption with at least one predetermined electrical consumption that is associated to the test operating mode, each predetermined electrical consumption being further associated to a different condition of at least one component of the system, and
    diagnosing the condition of at least one component of the system, based on the result of the comparison.

7. A method as claimed in claim 6, wherein the test operating mode is designed to diagnose which specific component of the system is failing.

8. A method as claimed in claim 6, wherein the test operating mode is designed to diagnose different possible failure conditions of a component.

9. A method as claimed in claim 1, wherein the measure of the electrical consumption and the comparison with predetermined electrical consumptions are performed at time intervals during the operation of the system.

10. A method as claimed in claim 1, comprising obtaining and recording predetermined electrical consumptions that are associated to a number of operating statuses of the system.

11. A method as claimed in claim 10, wherein said obtaining and recording predetermined electrical consumptions is done measuring an electrical consumption in the system running a test phase.

12. A method as claimed in claim 11, wherein said test phase is run on a sample system, representative of a plurality of systems, and the obtained predetermined electrical consumptions are recorded in said plurality of systems.

13. A method as claimed in claim 11, wherein said test phase is run on each single system and the obtained predetermined electrical consumptions are recorded only in said system.

14. A method as claimed in claim 1, wherein the measure of the electrical consumption is done in a controller to which a number of components of the system are connected.

15. A method as claimed in claim 1, wherein the system comprises a control unit of an apparatus.

16. A method as claimed in claim 15, wherein the intended operating status of the system is identified based on system operating instructions provided by the control unit.

17. A computer readable medium having computer-executable instructions stored thereon that, if executed by a computer, cause the computer to implement a method according to claim 1.

18. A method for diagnosing the condition of at least one electrical component of a system during operation, comprising:
    measuring an electrical consumption in the system as a whole, without individually measuring the electrical consumption of any device of the system;
    comparing the measured electrical consumption with a set of predetermined electrical consumptions corresponding to a plurality of different operating statuses of the system as a whole in which different combinations of devices of the system are consuming power; and
    diagnosing the condition of at least one component based on the comparison, including determining the different operating status in which the system as a whole is operating.

19. A method as claimed in claim 18, wherein the measure of the electrical consumption and the comparison with predetermined electrical consumptions are performed at time intervals during the operation of the system.

* * * * *

UNITED STATES PATENT AND TRADEMARK OFFICE
CERTIFICATE OF CORRECTION

PATENT NO. : 9,140,746 B2
APPLICATION NO. : 13/684208
DATED : September 22, 2015
INVENTOR(S) : Lopez Rodriguez et al.

Page 1 of 1

It is certified that error appears in the above-identified patent and that said Letters Patent is hereby corrected as shown below:

In the claims

Column 8, line 19, Claim 1, delete "intended status." and insert -- intended operating status. --, therefor.

Signed and Sealed this
Thirty-first Day of May, 2016

Michelle K. Lee
*Director of the United States Patent and Trademark Office*